US009366530B2

(12) United States Patent
Wilkinson et al.

(10) Patent No.: US 9,366,530 B2
(45) Date of Patent: Jun. 14, 2016

(54) METHOD AND SYSTEM FOR RECOMMENDING A DEFAULT SIZE OF A WEARABLE ITEM BASED ON INTERNAL DIMENSIONS

(75) Inventors: Matthew Tyler Wilkinson, Pittsburgh, PA (US); Grant B. Fresen, Pittsburgh, PA (US); Nicholas B. End, Pittsburgh, PA (US); Erich Wolodzko, Pittsburgh, PA (US)

(73) Assignee: Amazon Technologies, Inc., Seattle, WA (US)

( * ) Notice: Subject to any disclaimer, the term of this patent is extended or adjusted under 35 U.S.C. 154(b) by 517 days.

(21) Appl. No.: 13/492,462

(22) Filed: Jun. 8, 2012

(65) Prior Publication Data

US 2012/0316985 A1 Dec. 13, 2012

Related U.S. Application Data

(60) Provisional application No. 61/494,493, filed on Jun. 8, 2011.

(51) Int. Cl.
| | |
|---|---|
| *G06Q 30/00* | (2012.01) |
| *G01B 21/20* | (2006.01) |
| *A41H 1/00* | (2006.01) |
| *A43D 1/06* | (2006.01) |
| *A43D 1/02* | (2006.01) |

(52) U.S. Cl.
CPC *G01B 21/20* (2013.01); *A41H 1/00* (2013.01); *A43D 1/02* (2013.01); *A43D 1/06* (2013.01)

(58) Field of Classification Search
USPC ...................................... 705/26.1, 27.1, 26.7
See application file for complete search history.

(56) References Cited

U.S. PATENT DOCUMENTS

| | | | |
|---|---|---|---|
| 5,669,150 A | 9/1997 | Guertin et al. | |
| 6,192,593 B1 | 2/2001 | Borchers et al. | |
| 6,741,728 B1 * | 5/2004 | Genest | 382/115 |
| 7,805,851 B2 | 10/2010 | Pettersson | |
| 8,751,320 B1 * | 6/2014 | Kemist | 705/26.1 |
| 8,763,261 B1 | 7/2014 | Kemist | |
| 2004/0000255 A1 | 1/2004 | Hernandez | |
| 2004/0187332 A1 | 9/2004 | Kikuchi et al. | |
| 2005/0151963 A1 | 7/2005 | Pulla et al. | |
| 2007/0011173 A1 * | 1/2007 | Agostino | 707/10 |

(Continued)

OTHER PUBLICATIONS

International Search Report/Written Opinion of the International Searching Authority, PCT/US2012/041657, mailed Jan. 7, 2013.
F. Krakow, "Non-Slip", 18 Cycling Shoes in the RoadBIKE Test, Fascination Racing Cycle—RoadBIKE, Apr. 2009, pp. 73-78.
Krakow, "None-Slip", 18 Cycling Shoes in the RoadBIKE Test, Fascination Racing Cycle—RoadBIKE, Apr. 2009, pp. 73-78.

(Continued)

*Primary Examiner* — Brandy A Zukanovich
(74) *Attorney, Agent, or Firm* — Lee & Hayes, PLLC

(57) ABSTRACT

A system for recommending a size of a wearable item implements a method that includes identifying a reference wearable item and a size for the reference wearable item. The system accesses a wearable item database and retrieves a three-dimensional model of the reference wearable item. The system also receives, via a user interface, a functional requirement. The system accesses the wearable item database and identifies set of candidate objects, each of which satisfies the functional requirement. Based on the size of the reference wearable item, the system will determine a size for each of the candidate objects. The system will select at least one of the plurality of candidate objects as a recommended object and presents each recommended object and the size of each recommended object to a user.

19 Claims, 6 Drawing Sheets

(56) References Cited

U.S. PATENT DOCUMENTS

| | | |
|---|---|---|
| 2009/0241360 A1 | 10/2009 | Tait et al. |
| 2010/0238271 A1 | 9/2010 | Pfeiffer et al. |
| 2010/0293076 A1* | 11/2010 | End et al. .................. 705/27 |
| 2011/0178762 A1 | 7/2011 | York |
| 2011/0214501 A1 | 9/2011 | Ross et al. |
| 2011/0277250 A1 | 11/2011 | Langvin et al. |
| 2012/0035509 A1 | 2/2012 | Wilson et al. |

OTHER PUBLICATIONS

Office action for U.S. Appl. No. 13/492,221 mailed on Sep. 14, 2015, Wilkinson et al., "Internal Mesurement Collection System and Method of Using Same", 20 pages.

Office action for U.S. Appl. No. 13/492,221, mailed on Mar. 28, 2016, Wilkinson et al., "Internal Mesurement Collection System and Method of Using Same", 18 pages.

* cited by examiner

METHOD AND SYSTEM FOR RECOMMENDING A DEFAULT SIZE OF A WEARABLE ITEM BASED ON INTERNAL DIMENSIONS

RELATED APPLICATIONS AND CLAIM OF PRIORITY

This patent document claims priority to U.S. Provisional Patent Application No. 61/494,493, filed Jun. 8, 2011, the disclosure of which is hereby incorporated by reference in its entirety. This patent document is related to, and incorporates by reference in its entirety, U.S. patent application Ser. No. 13/492,221, filed Jun. 8, 2012, titled "Internal Measurement Collection System and Method of Using Same," which also claims priority to U.S. Provisional Patent Application No. 61/494,493.

BACKGROUND

Finding the correct footwear or apparel size to purchase from a remote location such as a web-based storefront, or in a store at an ordering kiosk, is difficult due to the inability to try on footwear or apparel, which subsequently leads to a high number of returns. Many choose not to shop for wearable items online because they cannot physically try on the footwear, apparel, or accessory and do not want the inconvenience of returning improper fitting items. Furthermore, those who do shop online typically purchase the same footwear, apparel, or accessory model and size with which they are familiar, thus limiting their selection potential.

Finding an ideal fit online is also problematic because of the lack of uniformity and consistency of sizing among manufacturers. For example, a size 10 in footwear from one manufacturer typically has different internal dimensions than a size 10 from another manufacturer. Even footwear from the same manufacturer may have sizes that differ between models in terms of their internal dimensions. Manufacturers constantly change and discontinue models, so there is typically a need for a user to assess a shoe's fit, even if the user previously found a good fit in a given shoe model.

When purchasing a shoe or other wearable item online, the purchaser must select which size to get. This results in confusion and indecision when it comes to size and model selection on footwear and apparel items.

This document describes a device and system that may solve at least some of the issues described above, and/or other problems.

SUMMARY

In an embodiment a system for of recommending a size of a wearable item uses a processor to implement a method that includes identifying a reference wearable item. The system accesses a wearable item database and retrieves a three-dimensional model of the reference wearable item. The system also receives, via a user interface, one or more wearable item attributes. The system accesses the wearable item database and identifies a set of candidate objects, each of which satisfies the attributes. Each candidate object also has a three-dimensional model. The system will compare each candidate object's model with the reference item's model to determine which candidate objects have modeled measurements that are within a fit distance threshold from the modeled measurements of the reference object. The system will select at least one of the candidate objects as a recommended object and presents each recommended object to a user.

In another embodiment, a recommendation system includes a processor, a wearable item database, and a non-transitory computer-readable medium. The medium contains programming instructions that, when executed, instruct the processor to identify a reference wearable item, retrieve a three-dimensional model of the reference wearable item from the wearable item database, and retrieve one or more wearable item attributes. The system will access the wearable item database to identify a set of candidate objects, each of which satisfies the one or more wearable item attributes. For each candidate object in the set, the system will determine whether a three-dimensional model of the candidate object is within a maximum fit distance from the three-dimensional model of the reference item, and if so classify the candidate object as a recommended object. The system will then output the recommended object to the user.

In another embodiment, a method of recommending a size of a wearable item includes receiving one or more wearable item attributes. Based on the attributes, the method includes developing a three-dimensional model of an industry average item, wherein the industry average item comprises a composite of a plurality of wearable items that satisfy the attributes. The method then includes accessing a wearable item database containing a plurality of potential objects having associated three-dimensional models, and selecting a candidate object from the database. For each considered potential object, the method will include identifying a plurality of internal measurements for the industry average item from the industry average item's three-dimensional model, identifying a plurality of internal measurements for the potential object from the potential object's three-dimensional model, comparing the plurality of internal measurements of the industry average item to the plurality of internal measurements for the potential object to identify a plurality of measurement differences, calculating a composite of the measurement differences, and if the composite is within a maximum fit threshold value, identifying the potential object as the candidate object. The method then includes presenting the candidate object as a recommendation to a user.

DETAILED DESCRIPTION

This disclosure is not limited to the particular systems, devices and methods described, as these may vary. The terminology used in the description is for the purpose of describing the particular versions or embodiments only, and is not intended to limit the scope.

As used in this document, the singular forms "a," "an," and "the" include plural references unless the context clearly dictates otherwise. Unless defined otherwise, all technical and scientific terms used herein have the same meanings as commonly understood by one of ordinary skill in the art. Nothing in this document is to be construed as an admission that the embodiments described in this document are not entitled to antedate such disclosure by virtue of prior invention. As used in this document, the term "comprising" means "including, but not limited to."

The use of electronic user interfaces for purchasing apparel, footwear and other wearable items is well known. For example, a web browser may receive instructions to serve a web page to the consumer, and the consumer may use the web page to browse available items and make purchases. Other user interfaces such as kiosks and vending systems are also available. In some situations, the electronic user interface may be in communication with a data storage facility that stores a profile for the consumer and/or for the products that the consumer is purchasing. Based on the consumer's profile and/or purchase data, the system may present one or more recommendations to the user via the user interface. A system and associated computer software for suggesting similar and/or best fitting size and model of an item is described in detail in U.S. patent application Ser. No. 12/800,549, the disclosure of which is hereby incorporated by reference in its entirety. This document describes improvements to such a system, as well as other innovations.

Figure 1:
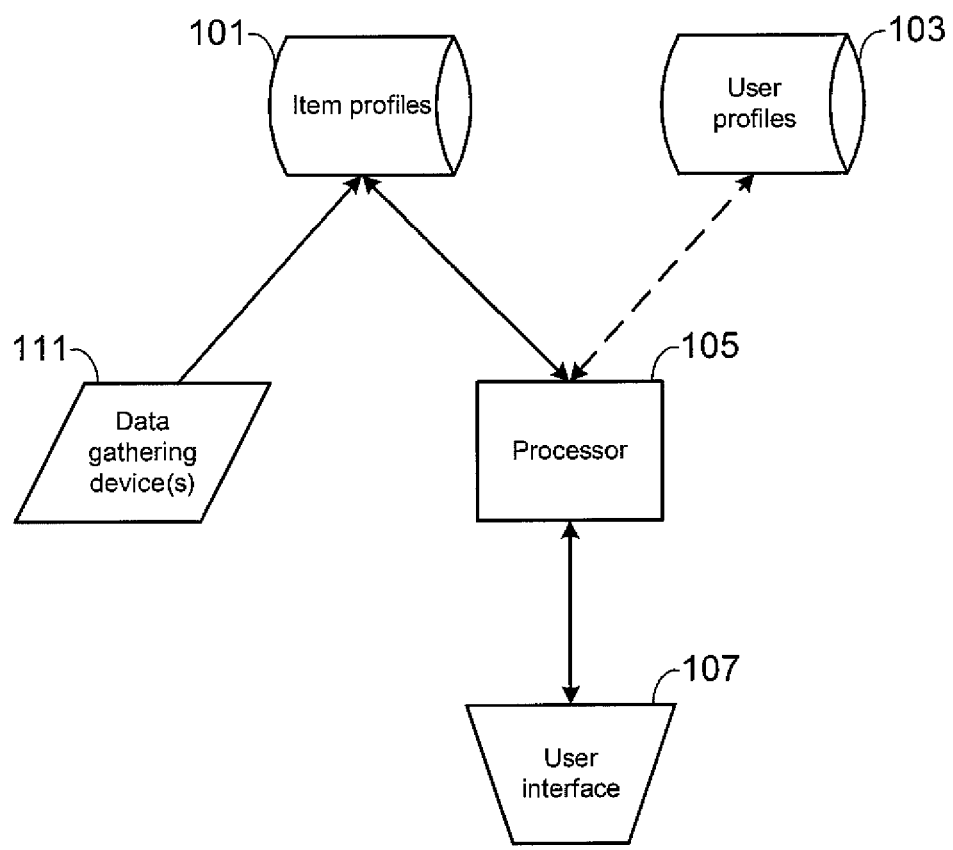
FIG. 1 illustrates various elements of a recommendation system.

FIG. 1 illustrates various elements of a recommendation system. A user may access the system via a user interface 107, such as a web browser, keyboard, touch screen, kiosk, or other electronic device through which a user may receive and transmit information to the system. The user interface communicates with a processor 105 via one or more communication networks such as the Internet or any combination of wired and/or wireless communication networks. The processor 105 is electronic communication with one or more data storage facilities, such as a database of item profiles 101 and a database of user profiles 103. The item profiles may include data corresponding to measured characteristics, and optionally other characteristics, of wearable items. A wearable item is an object that is created for the purpose of being worn by a human, such as footwear, clothing, hats and the like. The user profiles may include data for each user such as information identifying the user, preference information that the user has supplied to the system, and the user's purchase history.

The processor also may include or be connected to a computer-readable memory containing programming instructions that instruct the processor to perform various functions. In addition, a data gathering device 111 may be in direct or indirect communication with the item profile data storage facility 101 so that measured information may be transferred from the device to the data storage facility. A data gathering device is an electronic device that is used to gather internal dimensional and/or material property measurements of a wearable item.

Figure 2:
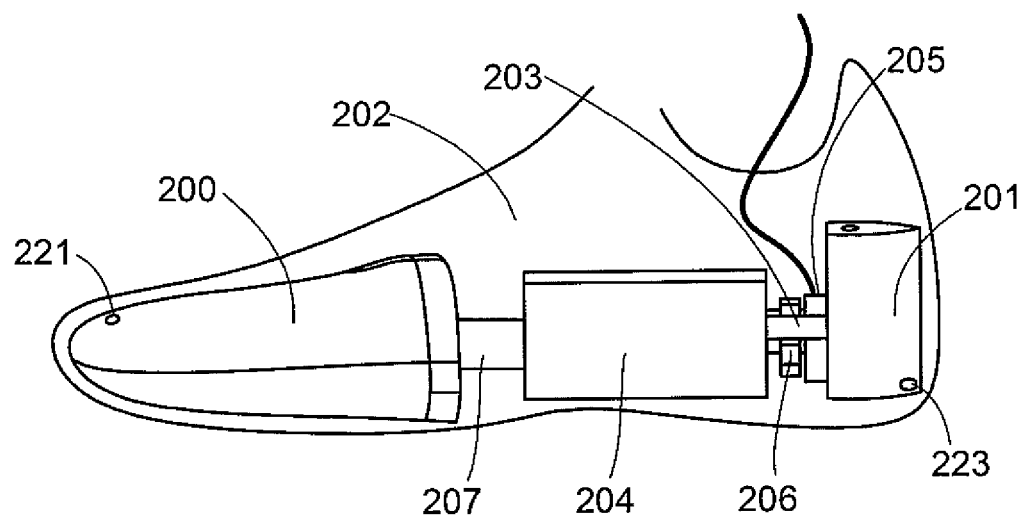
FIG. 2 is a cross-sectional view of a measurement device.

FIG. 2 shows an embodiment of a data gathering device, in this example a device that collects internal measurement data for a shoe 202. In this example, the internal measurement device includes a front or toe portion 200 connected via one or more elements to a rear or heel portion 201. The device further includes a guide bar 203 connecting the heel portion 201 to a base 204, a connector 207 connecting the toe portion 200 to the base 224, a force gauge 205 configured to provide force feedback on stretch and material deformation when the adjustable fixture is expanded, and a rotating knob 206 positioned about the guide bar 203 and configured to cause the adjustable fixture to expand or retract when rotated. In the embodiment illustrated in FIG. 2, the device has the form of a shoe tree, although other adjustable structures may be used for the device. Adjustable fixtures may be configured to fit within other objects of interest, such as garments, other footwear or other wearable items.

The force or pressure gauge 205 may be configured to provide feedback such that an operator of the adjustable fixture can make sure the amount of expansion of the adjustable fixture is consistent between shoes. A particular force may be applied to the adjustable fixture in order to capture the deformation and stretch of the shoe under similar weight bearing loads that a shoe experiences when being put on an individual's foot. A calculation to determine an amount of stretch and deformation for a shoe may be performed based upon the amount of expansion of the shoe fixture under a given force or forces. For example, each shoe measured may be subjected to a range of forces from 10 pounds per square inch (psi) to 100 psi. At each 10 psi increment (i.e., 10 psi, 20 psi, 30 psi, . . . ), the amount of stretch and deformation may be measured and recorded in the database along with the internal measurements of the shoe. Force feedback also may be collected from one or more pressure sensors 221, 223 located at the surface of the toe and/or heel portion A device such as the one shown in FIG. 2 may be used to gather various internal dimensions such as toe-box width, toe-box height, girth, internal length and other related dimensions. Various related values may be determined based upon the amount of stretch and deformation as well. For example, a support value may be determined based upon the amount of stretch. A shoe with a low value of stretch may be more likely to provide a high level of support. Similarly, a comfort level may be determined and stored based upon the amount of stretch and deformation. A shoe having a high level of stretch and deformation may result in a low comfort rating as the shoe may be likely to rub the wearer's foot in various areas due to the stretch and deformation.

Methods similar to those described for shoes are also applicable to apparel and accessories as well. The internal measurements of jeans, pants, shirts, bras, hats and headwear, handbags, and other apparel and accessories may be obtained by using an measurement device that is placed within the shirt, pant, bra, hat, handbag, or other apparel. A 3D digital model of the device is taken when in its compressed or normal state prior to expansion. As discussed above, each adjustable fixture may have an associated 3D digital model stored in a database and loaded by the measurement system upon initialization. The measurement device may be expanded inside the apparel item or accessory to determine a 3D digital model of the internal dimensions of the apparel item or accessory from which internal measurements may be determined.

Figure 3:
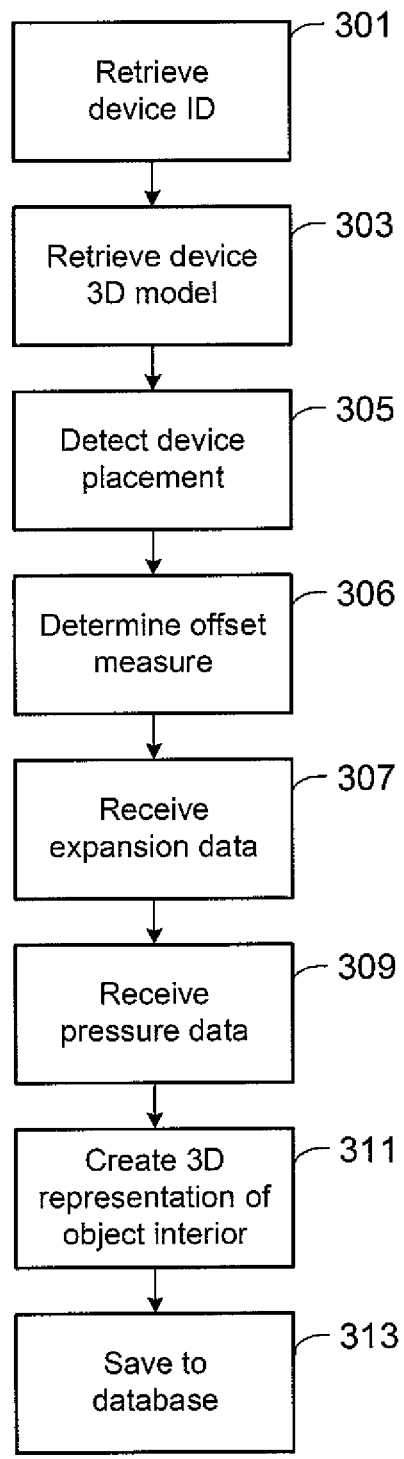
FIG. 3 is a flowchart showing elements of a data collection process.

FIG. 3 is a flow diagram showing steps that a measurement collection system such as the ones described above may follow to generate a 3D model of an interior of a shoe or other wearable item. A processor may implement programming instructions to apply the process, starting with obtaining a device ID 301, such as a serial number or other identifier that uniquely identifies the measuring device. The system may access a modeling database to retrieve one or more known physical characteristics of the device 303, such as a 3D model including various x, y and z (length, width and height) coordinates of a portion of the device.

The system may detect that the device has been placed into an wearable item to be measured 305, such as by detecting force applied to a sensor of the device's tip, or by a human input indicating that the device has been placed. The system may then determine an offset measure 306 for the device, to measure a lateral displacement that will correspond to the a length of the interior being measured. For example, for the device of FIG. 2, the offset measure may be an amount that the toe portion 200 has extended away from the base 204.

Returning to FIG. 3, if the measurement device is an expandable device such as that of FIG. 2, the system may receive expansion data 307, representing one or more measurements indicating how far one or more portions of the device have moved from a retracted position. For example, the toe portion of the device of FIG. 2 may expand when in a shoe, thus allowing the system to gather data as to the size and/or volume of the interior of the toe portion of the shoe. In addition, for any embodiment of the measurement device, the system may receive pressure data 309 from various sensors on the measurement device. The pressure data may include magnitude and directional elements. Magnitude elements may correspond to raw measurements of force applied to a sensor. Directional elements may be determined if the sensor is capable of collecting a directional component, or they may be determined from the 3D model of the measurement device based on a known position of the sensor. For example, it may be known that a sensor positioned on a top of the device will receive a downward pressure, while a sensor positioned on the bottom of the device will receive an upward pressure.

The processor will then use the dimensional and pressure data to create a 3D model of the interior of the object 311, and the model may be saved to a data storage facility 313 such as a computer-readable memory containing a searchable database. The dimensional data may be used to establish voxels or other 3D data points representing the volume and shape of the interior. The pressure data may be used to establish measurements of stretch at the edges of the interior, such as measurements that may be used to assess the given stretch of a textile in response to an applied force. For any given point in the volume, stretch may be measured as a vector difference between the x, y, and z values of the point at a location before the application of any force ($F_O$) and after the point moves in response to a predetermined amount of stretch force ($F_S$).

Thus, the data for each wearable item in the database may include volumetric pixels representing its interior volume, and some or all of the pixels may be characterized by quantitative and/or qualitative information such as size, shape and/or stretch characteristics of the textiles surrounding the interior. Quantitative parameters also may include, for the example of a shoe, toe tapering, calf girth or other girths, heel height or other heights, heel-to-toe drop, toe raise, arch support, stretch, sole thickness, strap thickness and/or location, and weight. Qualitative parameters for a shoe may include, for example, color, material, shoe type, cushioning, activity, activity surface, activity duration, style, purchase history, and biomechanical measurements. The system also may save information that is associated with the user, such as body metrics (weight, height, body type), purpose of the footwear or apparel (e.g., running, walking, hiking), activity frequency and activity duration. Qualitative and personal data may act as filters to narrow similar shoe fitting recommendations.

Figure 4:
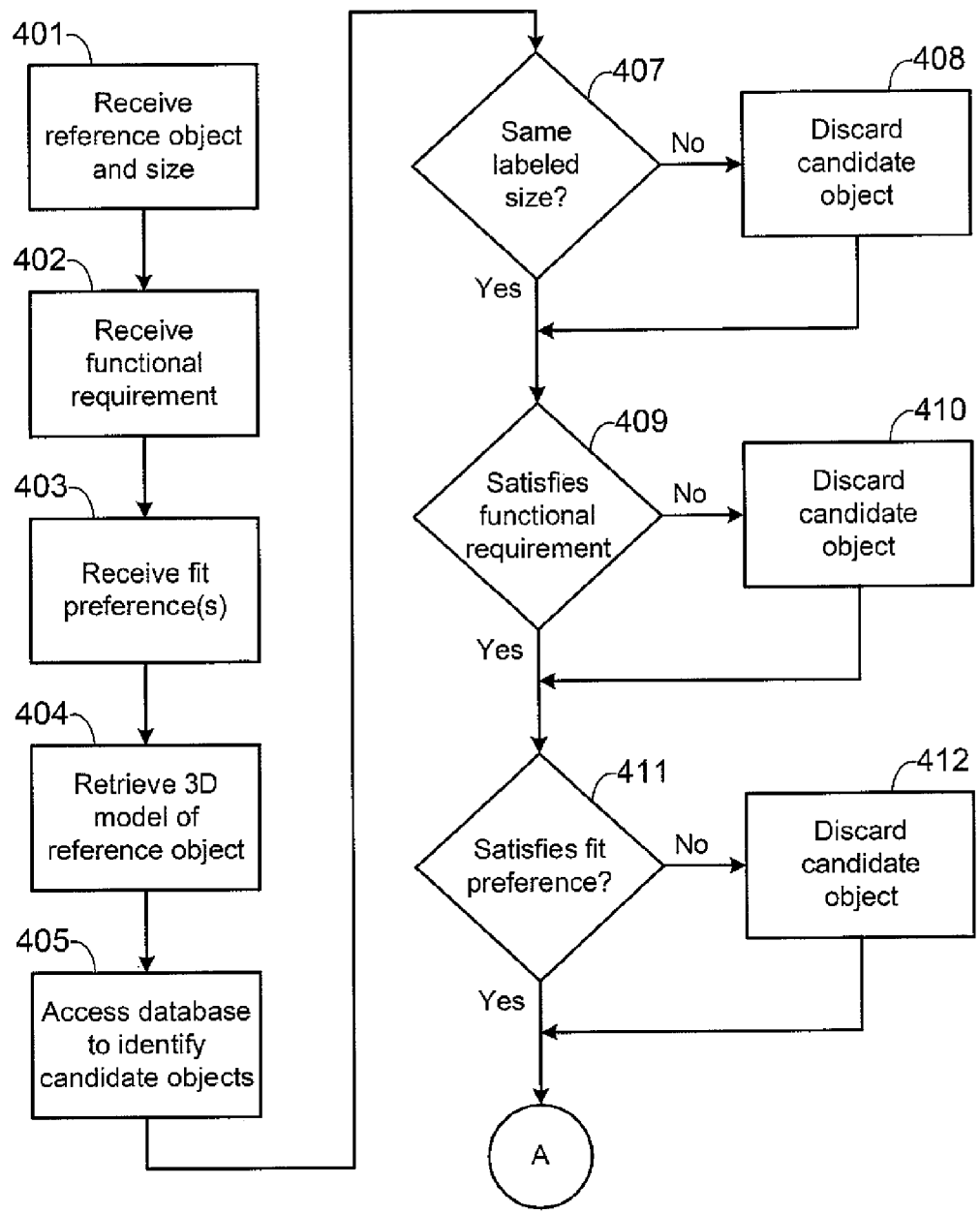
FIG. 4 is a flowchart showing elements of a recommendation process.
Figure 5:
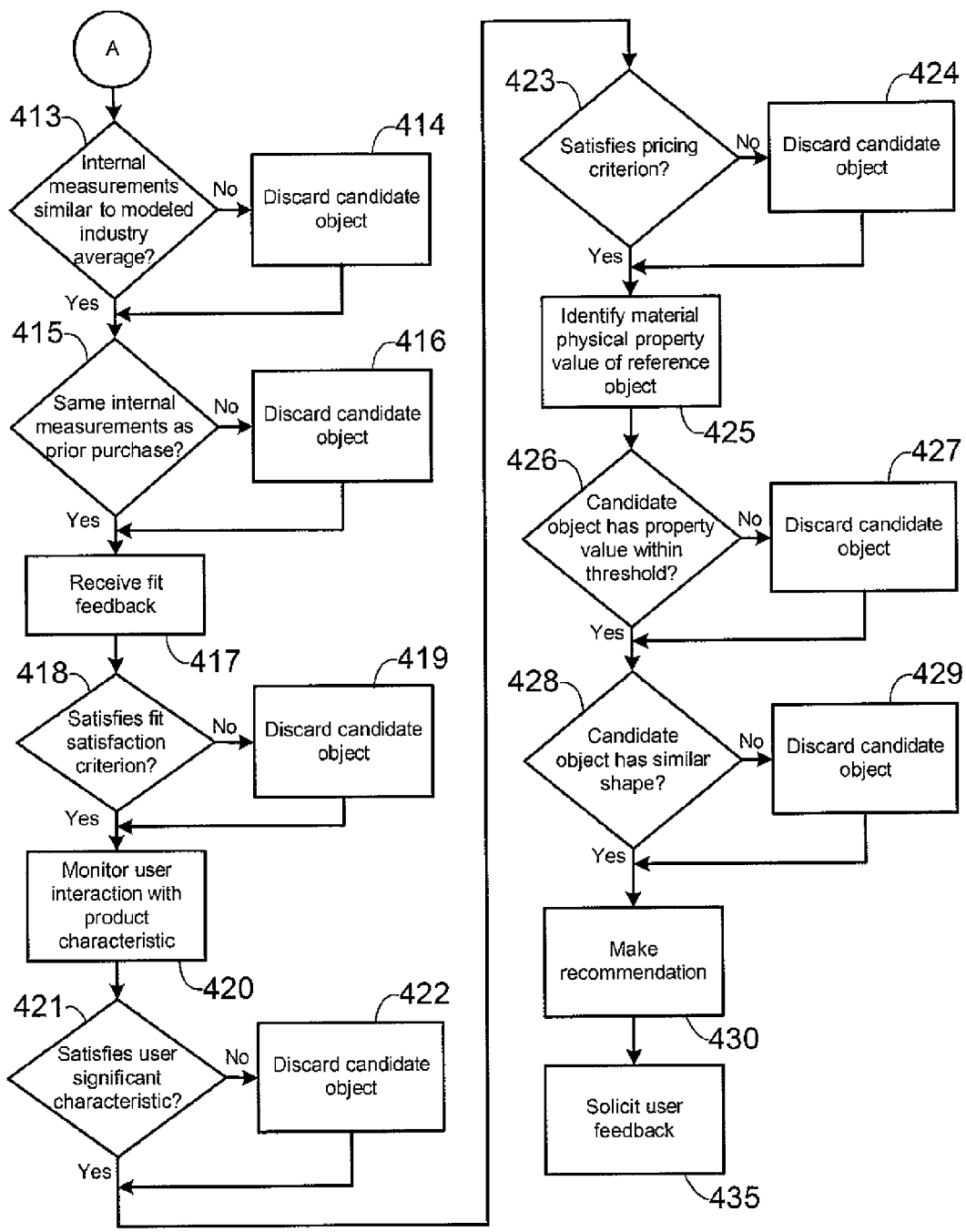
FIG. 5 is a flowchart showing additional elements of a recommendation process.

Once the database has been populated with 3D models relating to various wearable items from multiple vendors and manufacturers, the information may be used to recommend an item, including the recommended size of the item, to a user. FIGS. 4 and 5 illustrate various processes that a recommendation system may follow. It should be noted that although FIGS. 4 and 5 show the various steps as occurring sequentially, any of the steps may be considered optional, and various embodiments of the system may skip over one or more of the processes shown. Referring to FIG. 4, and using the example of a shoe, a user may access a retail computer system via a browser installed on a remote device or at a kiosk in a retail environment. The system may receive a command, input, file or other indicia of a reference wearable object and a size for the reference object 401. For example, the system may query a user as to the size and type of shoe that the user currently owns and likes, that the user previously owned, or which (based on user input) the system otherwise determines is a suitable reference object. The user may enter a response, such as a response indicating that the user currently wears a size 10 of a particular shoe. The system also may request and receive one or more other attributes of the reference object, such as a brand name, functional purpose or category, or other information.

Alternatively, the system may access a user profile or purchase history to identify an item or items that the user previously purchased. Such a step may be done automatically, or in response to a user input. The system or the user may select one or more of the purchased items as a reference object. For example, a user may enter a login/password combination or other identification such as an account number, email address or another similar identifier. The system may then access records related to the user. The records may include a user profile and/or previous purchasing information such as items and sizes purchased. If the system does not have any previously stored information, or if the user is new to the system, the user may be prompted to input information about previous purchases. For example, the computer system may present the user with an electronic form in which the user may enter prior purchase data. The form may ask for information related to clothing or other wearable items the user current owns and wears such as manufacturer, item style, item size, color and other related information. The form may also include questions related to subjective information such as comfort level of the current item.

The user also may enter or select, and the system may receive, a functional requirement 402 indicating a function for which the user intends to wear the object. A functional requirement is a description of an activity in which the user intends to participate while wearing the object. Examples include hiking, running, biking, or any other type of sports activity; a type of dance; a thermal requirement; and similar criteria. The functional requirement also may include a duration or distance length. For example, in the example of a shoe, the functional requirement may indicate that the user plans to wear the shoe for running 400-meter races. An alternate functional requirement may indicate that the user plans to wear the shoe to train for a marathon.

The user also may enter or select, and the system may receive, a fit preference 403. A fit preference is an indication that the user prefers that a specific portion of the wearable item to have either a snug fit or a loose fit. The fit preference may be an absolute preference, such as a preference that a shoe fit snugly in the heel area, or loose in the toe area. Alternatively, the fit preference may be relative to one or more reference items, such as an indication that the user would prefer a shoe that fits more snugly in the heel area than the user's reference shoe.

The system may access the database to retrieve the 3D model of the reference object 404. The 3D model will contain internal dimensions and material properties of the reference object. The system also may search the database to identify models having similar dimensional and material property values as those of the reference object 405. Dimensional comparisons may be performed using methods such as those described un U.S. patent application Ser. No. 12/800,549.

Optionally, to identify candidate objects, the system may determine a fit distance between each potential candidate object and the reference object. A fit distance is a measure of how far apart the internal measurements of two objects are, using a composite of three-dimensional measurement comparisons. For example, for a potential candidate shoe and the reference shoe, the system may compare toe-to-heel distance measurements, widest point measurements, upper-to-insole distance at a point that is a determined percentage of the toe-to-heel length away from the toe, and/or other measurements for the two shoes and determine a measurement of difference for each measurement. The system may determine the fit distance as the sum of the differences, an average of the distances, a function of a square of the distances, or as some other composite. If the fit distance is equal to or less than a threshold, then the system may select the potential object as a candidate object.

The 3D models for potential candidate objects may include metadata that contains labeled (i.e., manufacturer-provided) size information. In some embodiments, the system may only select an object as a candidate object if its labeled size matches or is within a threshold distance from the labeled size of the reference object. Alternatively, the system may initially select a set of candidate objects, examine each of their 3D model data to determine whether the candidate object's labeled size is the same size of the reference object 407, and discarding the candidate object 408 (i.e., removing or excluding it from consideration as a candidate object) if the sizes are not the same. Sizes may be considered to be the same if they match, or if they are no more than a threshold number of sizes or half-sizes away from each other.

The 3D models for potential candidate objects also may include metadata that contains functional information (i.e., intended uses) of the object. In some embodiments, the system may determine whether each potential candidate object's functional information satisfies (i.e., includes information that matches) the user-specified functional requirement 409. The system may discard the candidate object 408 if the functional requirement is not satisfied. A functional requirement may require that the object satisfy one or more material property physical characteristics. For example, a shoe that will be used for the functional requirement of running sprints may be required to be very lightweight. On the other hand, a shoe that will be used for the functional requirement of marathon training may be required to have a high amount of cushioning and high durability.

In some embodiments, the system may determine whether each potential candidate object's satisfies the user-specified fit preference 411. The system may discard the candidate object 412 if the fit preference is not satisfied. For example, to determine whether a candidate object satisfies the fit preference, the system may develop a "comfort score" for the candidate object. The system may require all candidate objects to have at least a minimum comfort score. The comfort score may be a modified function of the fit distance, or another comparison of the internal measurements of the candidate object and the reference object. The modification may address the user's preference and require, based on the user's preference, a closer fit or a looser fit for measurements in the are of the wearable object that corresponds to the fit preference. For example, the system may determine a weighted average of the differences between several internal fit measurements (e.g., heel-to-toe length, maximum toe area width, etc.) of a candidate shoe and a reference shoe. However, the system may not determine merely the absolute value of each difference, but also the fact of whether the difference is a positive or negative number. If the user prefers a loose fit in a particular area but the difference in measurements for that area between the reference shoe and the candidate shoe is negative (i.e., the candidate shoe has a smaller measurement than the reference shoe for that area), the candidate shoe may be discarded and removed from further consideration.

Referring to FIG. 5, in some embodiments, the computer system may create a 3D model of an "industry average" object that is based on the user's reference shoe and data for potential candidate objects. This may be done by receiving certain information from the user about attributes of a labeled object (e.g., brand, labeled size, and/or functional purpose), identifying a set of candidate objects that have the same or substantially similar attributes, selecting an internal measurement parameter for the reference object. Examples of internal measurement parameters include heel-to-toe length, heel-to-to drop (i.e., the vertical distance that the highest point on the heel surface sits above the highest point in the toe box area), toe box circumference, arch height, and maximum toe area width. The system may determine an average of the values of the internal measurement parameter for all candidate objects in the set. Additional averages may be determined for other internal measurement parameters, with the result being a 3D model using average measurements for all candidate objects in the set.

In some embodiments, the system may determine whether each potential candidate object's internal measurements (as found in the object's 3D model) are within a threshold fit distance away from the 3D industry average model 413. This may be done using any suitable comparison method, such as first by selecting an industry average for shoes that satisfy the reference shoe's labeled size and the user-specified functional requirement, then determining whether the potential candidate shoe is within a threshold fit distance from the industry average. The system may discard the candidate object 414 if the functional requirement is not satisfied.

As noted above, in some embodiments, the system may maintain a user profile with information of the user's prior purchases. In some embodiments, the system may determine whether each potential candidate object's internal measurements (as found in the object's 3D model) is the same as (i.e., equal to or within a threshold fit distance from) measurements found in the 3D models for one or more of the user's previously-purchased objects 415. The system may discard the candidate object 416 if sufficient similarity is not found.

As noted above, in some embodiments, the system may maintain a database with user fit feedback of various candidate objects. The feedback may include user ratings that focus on qualitative or quantitative measurements of how well the object fit, or how well the object satisfied material properties such as stretch, water resistance, warmth, and/or other properties. If fit feedback is available for a candidate object, the system may retrieve the fit feedback 417 and determine whether the feedback satisfies a minimum fit satisfaction criterion 418. For example, the system may require that the average fit feedback values be at least a threshold amount, that at least a minimum number of users have provided positive fit feedback, or other conditions. The system may discard the candidate object 419 if sufficient fit satisfaction is not found.

In some embodiments, the system may monitor user interaction with various products and their characteristics via the browser or other user interface 420. The product characteristics will include fit characteristics and/or functional characteristics. For example, the system may monitor a number of links selected, or time spent on pages, that primarily relate to product material property characteristics such as water-resistance, warmth, cushioning or other characteristics. If the user interaction with any criterion exceeds a threshold (such as a threshold period of time or number of clicks), the system may identify that characteristic as being significant to the user. Then, for each candidate object, the system may determine whether the candidate object satisfies the user-significant characteristic 421. For example, this may be done by reducing a threshold amount by which the candidate object may differ from the reference object for that characteristic. The system may discard the candidate object 422 if the candidate object does not satisfy the user-significant characteristic.

In some embodiments, the system may identify a pricing criterion and determine whether each candidate product satisfies the pricing criterion 423. For example, the system may receive a maximum price, a minimum price, or a price range from the user via the user interface. As another example, the system may identify pricing information for the user's prior purchases and limit recommendations to those objects whose price is no more than a maximum value above an average or highest of the user's prior purchase prices. Similarly, the system may limit recommendations to products having a price that is no less than, or no more than a minimum amount below, the average or lowest of the user's prior purchase price The system may discard the candidate object 424 if the candidate object does not satisfy the user-significant characteristic.

In some embodiments, the system may identify a value of a physical property of one or more materials of the reference object 425. For example, the system may receive a numeric measurement of stretch, cushioning, waterproofing, weight, or other physical properties of the object's materials of construction. The system may assess the available information for each candidate object and determine whether its material properties are similar, such as by including a value that is no more than a threshold difference away from the value for the reference object 426. The system may discard the candidate object 427 if the candidate object does not have similar material physical properties.

In some embodiments, the system may identify a shape similarity value, which corresponds to a measurement of shape similarity between the candidate object and the reference object 428. For example, the system may identify a 3D shape, such as a rectangular box, and set the dimensions of the shape to be at the outer boundaries of the 3D model of the reference object. In the context of a shoe, this may be a bounding box of minimum volume around the shoe model, oriented so that (i) two planes of the bounding box are parallel to a surface on which the shoe's sole naturally sits (e.g., the ground); and (ii) two planes of the bounding box are parallel to the surface. Next, the system may define central points of the 3D shape model by taking any number of (e.g., 50) evenly-spaced cross-sectional planes, moving along the length of the shoe. For each cross-sectional plane, the system may take the centroid of the left-most and right-most points that the plane intersects on the shoe model. The process may complete for each cross-sectional plane to define a set of central points. Shape similarity may then be determined by, for the nth pair of central points in either model, determining how "centered" each point is un the bounding box that contains it by measuring its distance from one side wall of the bounding box and dividing that quantity by the bounding box width. The shape similarity value may then be a weighted average of the differences between these quantities.

Once the system has completed some or all of the processes described above, if any candidate objects remain the system may present those objects to the user as recommended objects for purchase 430. These suggestions, along with the objects' associated sizes, and optionally along with one or more advertisements, may reach the user through a retail site or online ad where a footwear, apparel, or accessory model with similar internal measurements as those previously purchased by the user. Alternatively, the recommendations and/or advertisements may be delivered to the user via a message delivery service such as email or text messaging. The recommendation may show visually how the footwear, apparel, or accessory compares to the user's previously purchased footwear, apparel, or accessory by displaying the comfort level. For example, if a shoe store receives a new style of shoe, a user's previously purchased items may be used to determine the user's size in the new shoe, and a marketing software program associated with the shoe store may send a targeted advertisement to the user including an offer to purchase the new shoe in the user's determined size.

Optionally, after making a recommendation, the system may solicit user feedback on the recommendation 435. The feedback will include user feedback as to the user's opinion about the recommended item's actual fit and/or comfort. It may then user that information to refine the recommendation using some or all of the steps described above. For example, if a user says that a recommended shoe "runs small," then the system may use that information as a fit preference 403 (i.e., an indication that the user prefers shoes having certain dimensions that are larger than those of the recommended shoe). It may then consider that and make more targeted recommendations to the user by limiting the candidate objects to those that satisfy the newly-identified fit preference 411.

Figure 6:
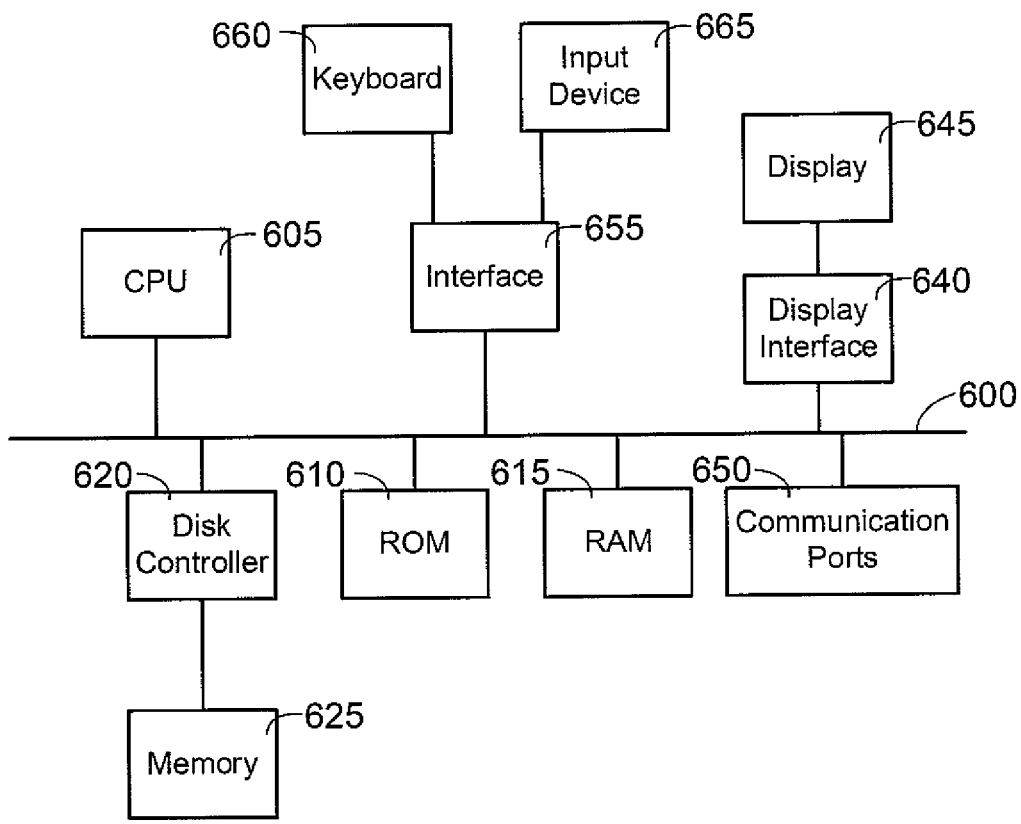
FIG. 6 illustrates elements of computer hardware that may be used with the disclosed methods and systems.

FIG. 6 depicts a block diagram of internal hardware that may be used to contain collect and process data that is captured by the device described above. A bus 600 serves as the main information highway interconnecting the other illustrated components of the hardware. CPU 605 is a processor that performs calculations and logic operations required to execute a program. Read only memory (ROM) 610 and random access memory (RAM) 615 constitute examples of memory devices.

A controller 620 provides an interface between one or more optional tangible, computer-readable memory devices 625 and the system bus 600. These memory devices 625 may include, for example, an external or internal DVD or CD ROM drive, a hard drive, flash memory, a USB drive or the like. These various drives and controllers are optional devices. Additionally, the memory devices 625 may be configured to include individual files for storing any software modules or instructions, auxiliary data, common files for storing groups of results or auxiliary, or one or more databases for storing the result information, auxiliary data, and related information as discussed above.

Program instructions, software or interactive modules for performing any of the methods and systems as discussed above may be stored in the ROM 610 and/or the RAM 615. Optionally, the program instructions may be stored on a tangible computer readable medium such as a compact disk, a digital disk, flash memory, a memory card, a USB drive, an optical disc storage medium, such as a Blu-ray™ disc, and/or other recording medium.

An optional display interface 640 may permit information from the bus 600 to be displayed on the display 645 in audio, visual, graphic or alphanumeric format. The information may include information related to a current job ticket and associated tasks. Communication with external devices may occur using various communication ports 650. An exemplary communication port 650 may be attached to a communications network, such as the Internet or an local area network.

The hardware may also include an interface 655 which allows for receipt of data from input devices such as a keyboard 660 or other input device 665 such as a mouse, a joystick, a touch screen, a remote control, a pointing device, a video input device and/or an audio input device.

Various of the above-disclosed and other features and functions, or alternatives thereof, may be combined into many other different systems or applications. Various presently unforeseen or unanticipated alternatives, modifications, variations or improvements therein may be subsequently made by those skilled in the art, each of which is also intended to be encompassed by the disclosed embodiments.

The invention claimed is:

1. A method comprising:
   collecting, by a measurement device that has been inserted into a candidate wearable item and that has been expanded, a plurality of measurements of the candidate wearable item, wherein the plurality of measurements of the candidate wearable item includes at least a first measurement related to a shape of the candidate wearable item and a second measurement related to a stretch of the candidate wearable item;
   storing, in a wearable item database, the plurality of measurements in association with a three-dimensional model of the candidate wearable item;
   identifying a reference wearable item for a user;
   retrieving, from the wearable item database, a three-dimensional model of the reference wearable item;
   receiving one or more wearable item attributes;
   determining that the candidate wearable item satisfies the one or more wearable item attributes;
   retrieving, from the wearable item database, the three-dimensional model of the candidate wearable item;
   identifying a plurality of measurements of the reference wearable item from the three-dimensional model of the reference wearable item, wherein the plurality of measurements of the reference wearable item includes at least a third measurement related to a shape of the reference wearable item and a fourth measurement related to a stretch of the reference wearable item;
   identifying the plurality of measurements of the candidate wearable item from the three-dimensional model of the candidate wearable item;
   comparing the plurality of measurements of the reference wearable item to the plurality of measurements of the candidate wearable item to identify a plurality of measurement differences;
   calculating a composite value of the plurality of measurement differences;
   determining that the three-dimensional model of the candidate wearable item is within a maximum fit distance of the three-dimensional model of the reference wearable item based at least in part on a determination that the composite value is less than or equal to a threshold value;
   selecting the candidate wearable item as a recommended wearable item; and
   causing the recommended wearable item to be presented on a device associated with the user.

2. The method of claim 1, wherein the one or more wearable item attributes comprise a labeled size.

3. The method of claim 1, further comprising:
   receiving a pricing criterion; and
   determining that the candidate wearable item has a price that satisfies the pricing criterion prior to selecting the candidate wearable item as the recommended wearable item.

4. The method of claim 1, further comprising:
   causing a plurality of product characteristic descriptors to be presented;
   monitoring a level of user interaction with the plurality of product characteristic descriptors to determine a user-significant product characteristic; and
   determining that the candidate wearable item satisfies the user-significant product characteristic prior to selecting the candidate wearable item as the recommended wearable item.

5. The method of claim 1, further comprising:
   identifying a material physical property value of the reference wearable item; and
   determining that the candidate wearable item has a material physical property value that is within a threshold distance from the material physical property value of the reference wearable item prior to selecting the candidate wearable item as the recommended wearable item.

6. The method of claim 1, further comprising:
   comparing a shape of the candidate wearable item with a shape of the reference wearable item;
   based on the comparing, determining a shape similarity value for the candidate wearable item; and
   determining that the shape similarity value that is above a threshold prior to selecting the candidate wearable item as the recommended wearable item.

7. The method of claim 1, wherein the measurement device comprises a positional sensor configured to obtain volumetric data, the method further comprising determining the first measurement related to the shape of the candidate wearable item using the volumetric data.

8. The method of claim 1, wherein the measurement device comprises a pressure sensor configured to obtain pressure data, the method further comprising determining the second measurement related to the stretch of the candidate wearable item using the pressure data.

9. A system, comprising:
   a measurement device inserted into a candidate wearable item and expanded to collect a plurality of measurements of the candidate wearable item, wherein the plurality of measurements of the candidate wearable item includes at least a first measurement related to a shape of the candidate wearable item and a second measurement related to a stretch of the candidate wearable item;
   a wearable item database to store the plurality of measurements of the candidate wearable item in association with a three-dimensional model of the candidate wearable item;
   a processor; and
   a computer-readable medium containing programming instructions that, when executed, instruct the processor to:
     identify a reference wearable item for a user;
     retrieve, from the wearable item database, a three-dimensional model of the reference wearable item;
     receive one or more wearable item attributes;
     determine that the candidate wearable item satisfies the one or more wearable item attributes;
     retrieve, from the wearable item database, the three-dimensional model of the candidate wearable item;
     identify a plurality of measurements of the reference wearable item from the three-dimensional model of the reference wearable item, wherein the plurality of measurements of the reference wearable item includes at least a third measurement related to a shape of the reference wearable item and a fourth measurement related to a stretch of the reference wearable item;
     identify the plurality of measurements of the candidate wearable item from the three-dimensional model of the candidate wearable item;
     compare the plurality of measurements of the reference wearable item to the plurality of measurements of the candidate wearable item to identify a plurality of measurement differences;
     calculate a composite value of the plurality of measurement differences;

determine that the three-dimensional model of the candidate wearable item is within a maximum fit distance of the three-dimensional model of the reference wearable item based at least in part on a determination that the composite value is less than or equal to a threshold value;
select the candidate wearable item as a recommended wearable item; and
cause the recommended wearable item to be presented on a device associated with the user.

10. The system of claim 9, wherein the one or more wearable item attributes comprise a labeled size.

11. The system of claim 9, wherein the computer-readable medium further comprises instructions that, when executed, instruct the processor to:
receive a pricing criterion; and
determine that the candidate wearable item has a price that satisfies the pricing criterion prior to selecting the candidate wearable item as the recommended wearable item.

12. The system of claim 9, wherein the computer-readable medium further comprises instructions that, when executed, instruct the processor to:
cause a plurality of product characteristic descriptors to be presented;
monitor a level of user interaction with the plurality of product characteristic descriptors to determine a user-significant product characteristic; and
determine that the candidate wearable item satisfies the user-significant product characteristic prior to selecting the candidate wearable item as the recommended wearable item.

13. The system of claim 9, wherein the computer-readable medium further comprises instructions that, when executed, instruct the processor to:
identify a material physical property value of the reference wearable item; and
determine that the candidate wearable item has a material physical property value that is within a threshold distance from the material physical property value of the reference wearable item prior to selecting the candidate wearable item as the recommended wearable item.

14. The system of claim 9, wherein the computer-readable medium further comprises instructions that, when executed, instruct the processor to:
compare a shape of the candidate wearable item with a shape of the reference wearable item;
based on the comparing, determine a shape similarity value for the candidate wearable item; and
determine that the shape similarity value that is above a threshold prior to selecting the candidate wearable item as the recommended wearable item.

15. The system of claim 9, wherein the measurement device comprises a positional sensor configured to obtain volumetric data, the first measurement related to the shape of the candidate wearable item being determined using the volumetric data.

16. The system of claim 9, wherein the measurement device comprises a pressure sensor configured to obtain pressure data, the second measurement related to the stretch of the candidate wearable item being determined using the pressure data.

17. One or more non-transitory computer-readable media storing instructions that, when executed by one or more processors, configure a device to:
insert a measurement device into a candidate wearable item and expand the measurement device to collect a plurality of measurements of the candidate wearable item, wherein the plurality of measurements of the candidate wearable item includes at least a first measurement related to a shape of the candidate wearable item and a second measurement related to a stretch of the candidate wearable item;
store, in a wearable item database, the plurality of measurements of the candidate wearable item in association with a three-dimensional model of the candidate wearable item;
identify a reference wearable item for a user;
retrieve, from the wearable item database, a three-dimensional model of the reference wearable item;
receive one or more wearable item attributes;
determine that the candidate wearable item satisfies the one or more wearable item attributes;
retrieve, from the wearable item database, the three-dimensional model of the candidate wearable item;
identify a plurality of measurements of the reference wearable item from the three-dimensional model of the reference wearable item, wherein the plurality of measurements of the reference wearable item includes at least a third measurement related to a shape of the reference wearable item and a fourth measurement related to a stretch of the reference wearable item;
identify the plurality of measurements of the candidate wearable item from the three-dimensional model of the candidate wearable item;
compare the plurality of measurements of the reference wearable item to the plurality of measurements of the candidate wearable item to identify a plurality of measurement differences;
calculate a composite value of the plurality of measurement differences;
determine that the three-dimensional model of the candidate wearable item is within a maximum fit distance of the three-dimensional model of the reference wearable item based at least in part on a determination that the composite value is less than or equal to a threshold value;
select the candidate wearable item as a recommended wearable item; and
cause the recommended wearable item to be presented on a user device.

18. The one or more non-transitory computer-readable media of claim 17, wherein the measurement device comprises a positional sensor configured to obtain volumetric data, the first measurement related to the shape of the candidate wearable item being determined using the volumetric data.

19. The one or more non-transitory computer-readable media of claim 17, wherein the measurement device comprises a pressure sensor configured to obtain pressure data, the second measurement related to the stretch of the candidate wearable item being determined using the pressure data.

* * * * *